(12) United States Patent
Smets et al.

(10) Patent No.: US 7,423,743 B2
(45) Date of Patent: Sep. 9, 2008

(54) METHOD AND AN APPARATUS FOR MEASURING POSITIONS OF CONTACT ELEMENTS OF AN ELECTRONIC COMPONENT

(75) Inventors: Carl Smets, Heverlee (BE); Karel Van Gils, Heverlee (BE); John Zabolitsky, Heverlee (BE); Jurgen Everaerts, Heverlee (BE)

(73) Assignee: Icos Vision Systems NV, Heverlee (BE)

( * ) Notice: Subject to any disclaimer, the term of this patent is extended or adjusted under 35 U.S.C. 154(b) by 511 days.

(21) Appl. No.: 10/465,933

(22) PCT Filed: Jan. 2, 2002

(86) PCT No.: PCT/BE02/00001

§ 371 (c)(1),
(2), (4) Date: Sep. 29, 2003

(87) PCT Pub. No.: WO02/054849

PCT Pub. Date: Jul. 11, 2002

(65) Prior Publication Data

US 2004/0085549 A1      May 6, 2004

(30) Foreign Application Priority Data

Dec. 29, 2000    (EP) .................................. 00204761

(51) Int. Cl.
*G01N 21/00*        (2006.01)

(52) U.S. Cl. .................... 356/237.1; 356/614; 382/148; 382/149

(58) Field of Classification Search ......... 356/614–623, 356/394, 237.1–237.5; 348/87, 126; 250/559.4, 250/559.46; 382/146, 149
See application file for complete search history.

(56) References Cited

U.S. PATENT DOCUMENTS

| 3,534,019 | A | 10/1970 | Coyne et al. |
| 3,671,726 | A | 6/1972 | Kerr et al. |
| 4,259,589 | A | 3/1981 | DiMatteo et al. |

(Continued)

FOREIGN PATENT DOCUMENTS

CA        2282498        9/1998

(Continued)

OTHER PUBLICATIONS

CI-8250 The Complete High Speed Inspection System, ICOS Product Pamphlet, Mar. 1997.

(Continued)

*Primary Examiner*—Hoa Q Pham
(74) *Attorney, Agent, or Firm*—Gordon T. Arnold; Charles S. Knobloch; Arnold & Knobloch, L.L.P.

(57) ABSTRACT

A method and an apparatus for measuring respective positions of a set of N contact elements of an electronic component. A first and a second light path are created by a first and a second light beam which have different viewing angles. Both the first and the second light path can selectively be opened and both end into the image plane of a single camera. The positions being determined by using the first and second image produced by the first and second light beam respectively.

9 Claims, 4 Drawing Sheets

U.S. PATENT DOCUMENTS

| | | | |
|---|---|---|---|
| 4,314,763 A | 2/1982 | Steigmeier et al. | |
| 4,555,798 A | 11/1985 | Broadbent, Jr. et al. | |
| 4,589,141 A | 5/1986 | Christian et al. | |
| 4,601,053 A | 7/1986 | Grumet | |
| 4,677,473 A * | 6/1987 | Okamoto et al. | 348/126 |
| 4,686,565 A | 8/1987 | Ando | |
| 4,688,939 A | 8/1987 | Ray | |
| 4,715,921 A | 12/1987 | Maher et al. | |
| 4,733,969 A | 3/1988 | Case et al. | |
| 4,739,175 A | 4/1988 | Tamura | |
| 4,772,125 A | 9/1988 | Yoshimura et al. | |
| 4,774,403 A | 9/1988 | Arts | |
| 4,785,177 A | 11/1988 | Besocke | |
| 4,793,707 A | 12/1988 | Hata et al. | |
| 4,818,110 A | 4/1989 | Davidson | |
| 4,852,516 A | 8/1989 | Rubin et al. | |
| 4,891,772 A | 1/1990 | Case et al. | |
| 4,893,183 A | 1/1990 | Nayar | |
| 4,904,012 A | 2/1990 | Nishiguchi et al. | |
| 4,959,898 A | 10/1990 | Landman | |
| 5,003,600 A | 3/1991 | Deason | |
| 5,013,311 A | 5/1991 | Nouri | |
| 5,023,917 A | 6/1991 | Bose | |
| 5,024,529 A | 6/1991 | Svetkoff et al. | |
| 5,032,735 A | 7/1991 | Kobayashi | |
| 5,043,589 A * | 8/1991 | Smedt et al. | 250/559.08 |
| 5,058,178 A | 10/1991 | Ray | |
| 5,105,149 A | 4/1992 | Tokura | |
| 5,140,643 A | 8/1992 | Izumi et al. | |
| 5,142,357 A | 8/1992 | Lipton | |
| 5,173,796 A | 12/1992 | Palm | |
| 5,239,355 A | 8/1993 | Hirose | |
| 5,343,294 A | 8/1994 | Kuckel | |
| 5,347,363 A | 9/1994 | Yamanaka | |
| 5,355,283 A | 10/1994 | Marrs et al. | |
| 5,364,219 A | 11/1994 | Takahashi et al. | |
| 5,380,682 A | 1/1995 | Edwards et al. | |
| 5,383,013 A | 1/1995 | Cox | |
| 5,410,259 A | 4/1995 | Fujihara et al. | |
| 5,414,458 A | 5/1995 | Harris et al. | |
| 5,422,852 A | 6/1995 | Houston et al. | |
| 5,444,296 A | 8/1995 | Kaul et al. | |
| 5,452,080 A * | 9/1995 | Tomiya | 356/237.1 |
| 5,465,152 A | 11/1995 | Bilodeau | |
| 5,528,371 A | 6/1996 | Sato | |
| 5,546,189 A | 8/1996 | Svetkoff | |
| 5,559,727 A | 9/1996 | Deley | |
| 5,561,696 A | 10/1996 | Adams et al. | |
| 5,563,703 A | 10/1996 | Lebeau | |
| 5,574,668 A | 11/1996 | Beaty | |
| 5,574,801 A | 11/1996 | Collet-Beillon | |
| 5,592,562 A | 1/1997 | Rooks | |
| 5,617,209 A | 4/1997 | Svetkoff | |
| 5,621,530 A | 4/1997 | Marrable | |
| 5,636,025 A | 6/1997 | Bieman | |
| 5,648,853 A | 7/1997 | Stern | |
| 5,652,658 A | 7/1997 | Jackson | |
| 5,672,965 A | 9/1997 | Kurafuchi | |
| 5,737,084 A | 4/1998 | Ishihara | |
| 5,760,907 A * | 6/1998 | Basler et al. | 356/390 |
| 5,798,195 A | 8/1998 | Nishi | |
| 5,812,268 A | 9/1998 | Jackson | |
| 5,815,275 A | 9/1998 | Svetkoff | |
| 5,828,449 A | 10/1998 | King et al. | |
| 5,832,107 A | 11/1998 | Choate | |
| 5,835,133 A | 11/1998 | Moreton | |
| 5,862,973 A | 1/1999 | Wasserman | |
| 5,909,285 A | 6/1999 | Beaty et al. | |
| 5,910,844 A * | 6/1999 | Phillips et al. | 356/614 |
| 5,943,125 A | 8/1999 | King et al. | |
| 5,956,134 A | 9/1999 | Roy et al. | |
| 5,995,220 A * | 11/1999 | Suzuki | 356/237.5 |
| 6,005,965 A | 12/1999 | Tsuda et al. | |
| 6,028,671 A | 2/2000 | Svetkoff | |
| 6,043,876 A | 3/2000 | Holliday | |
| 6,053,687 A | 4/2000 | Kirkpatrick et al. | |
| 6,055,055 A * | 4/2000 | Toh | 356/609 |
| 6,064,756 A | 5/2000 | Beaty et al. | 382/146 |
| 6,064,757 A | 5/2000 | Beaty et al. | 382/147 |
| 6,072,898 A | 6/2000 | Beaty et al. | 382/146 |
| 6,097,491 A * | 8/2000 | Hartrumpf | 356/622 |
| 6,098,031 A | 8/2000 | Svetkoff | |
| 6,100,922 A | 8/2000 | Honda | |
| 6,118,540 A | 9/2000 | Roy et al. | |
| 6,128,034 A | 10/2000 | Harris | |
| 6,166,393 A | 12/2000 | Paul et al. | |
| 6,177,682 B1 | 1/2001 | Bartulovic | |
| 6,198,529 B1 | 3/2001 | Clark, Jr. et al. | |
| 6,201,892 B1 | 3/2001 | Ludlow et al. | |
| 6,236,747 B1 | 5/2001 | King et al. | |
| 6,242,756 B1 * | 6/2001 | Toh et al. | 250/559.34 |
| 6,262,803 B1 | 7/2001 | Hallerman | |
| 6,271,918 B2 * | 8/2001 | Blais | 356/625 |
| 6,307,210 B1 | 10/2001 | Suzuki | |
| 6,334,922 B1 | 1/2002 | Tanaka et al. | |
| 6,336,787 B1 | 1/2002 | Chang et al. | |
| 6,371,637 B1 | 4/2002 | Atchinson et al. | |
| 6,373,565 B1 | 4/2002 | Kafka et al. | |
| 6,407,809 B1 | 6/2002 | Finarov et al. | |
| 6,437,312 B1 | 8/2002 | Adler | |
| 6,452,201 B1 | 9/2002 | Wang et al. | |
| 6,504,144 B1 | 1/2003 | Murata | |
| 6,518,997 B1 * | 2/2003 | Chow et al. | 348/126 |
| 6,526,331 B2 | 2/2003 | Ngoi | |
| 6,539,107 B1 | 3/2003 | Michael | |
| 6,592,318 B2 | 7/2003 | Aggarwal | |
| 6,611,344 B1 | 8/2003 | Chuang et al. | |
| 6,636,302 B2 | 10/2003 | Nikoonahad et al. | |
| 6,671,397 B1 | 12/2003 | Mahon | |
| 6,745,637 B2 | 6/2004 | Tegeder et al. | |
| 6,778,282 B1 * | 8/2004 | Smets et al. | 356/614 |
| 6,813,016 B2 * | 11/2004 | Quist | 356/237.1 |
| 6,862,365 B1 | 3/2005 | Beaty et al. | 382/145 |
| 6,915,006 B2 | 7/2005 | Beaty et al. | 382/145 |
| 6,915,007 B2 | 7/2005 | Beaty et al. | 382/145 |
| 6,970,238 B2 | 11/2005 | Gerhard et al. | |
| 7,079,678 B2 | 7/2006 | Beaty et al. | |
| 7,085,411 B2 | 8/2006 | Beaty et al. | |
| 2002/0012502 A1 | 1/2002 | Farrar et al. | |
| 2002/0034324 A1 | 3/2002 | Beaty et al. | |
| 2002/0037098 A1 | 3/2002 | Beaty et al. | |
| 2003/0133776 A1 | 7/2003 | Lee | |
| 2004/0085549 A1 | 5/2004 | Smets et al. | |
| 2004/0099710 A1 | 5/2004 | Sommer | |

FOREIGN PATENT DOCUMENTS

| | | |
|---|---|---|
| CN | 1662790 | 8/2005 |
| DE | 0677739 | 7/1939 |
| DE | 3534019 A1 | 4/1987 |
| DE | 4304301 A1 | 8/1994 |
| DE | 4422861 A1 | 1/1996 |
| DE | 19734074 A1 | 2/1998 |
| EP | 0335559 A2 | 10/1989 |
| EP | 0385625 A2 | 9/1990 |
| EP | 0377464 A2 | 11/1990 |
| EP | 0485803 A1 | 5/1992 |
| EP | 0557558 A1 | 9/1993 |
| EP | 0638801 | 2/1995 |
| EP | 0677739 A1 | 10/1995 |
| EP | 0679864 A1 | 11/1995 |
| EP | 0696733 A1 | 2/1996 |
| EP | 0724773 | 8/1996 |
| EP | 0742898 | 11/1996 |

| | | |
|---|---|---|
| EP | 0994328 | 4/2000 |
| EP | 1014438 | 6/2000 |
| EP | 1220596 A1 | 7/2002 |
| EP | 1233442 A2 | 8/2002 |
| EP | 1371939 A1 | 12/2003 |
| EP | 1619623 A1 | 1/2006 |
| JP | 62088009 A | 4/1987 |
| JP | 2206709 | 8/1990 |
| JP | 2232506 | 9/1990 |
| JP | 3210410 | 9/1991 |
| JP | 4198846 A | 7/1992 |
| JP | 4346011 | 12/1992 |
| JP | 06003124 | 1/1994 |
| JP | 6137825 | 5/1994 |
| JP | 6160057 A | 6/1994 |
| JP | 7151522 | 6/1995 |
| JP | 07320062 | 12/1995 |
| JP | 08115964 | 5/1996 |
| JP | 08122273 | 5/1996 |
| JP | 9042946 | 2/1997 |
| JP | 09089536 | 4/1997 |
| JP | 9304030 | 11/1997 |
| JP | 10026591 | 1/1998 |
| JP | 10062121 | 3/1998 |
| JP | 10104033 | 4/1998 |
| JP | 10148517 A | 6/1998 |
| JP | 10227620 | 8/1998 |
| JP | 10227623 | 8/1998 |
| JP | 10232114 | 8/1998 |
| JP | 11006965 A | 1/1999 |
| JP | 11064232 A | 3/1999 |
| JP | 11231228 A | 8/1999 |
| JP | 11351841 | 12/1999 |
| JP | 2000098257 A | 4/2000 |
| JP | 200352661 A | 12/2000 |
| JP | 2002217250 | 8/2002 |
| WO | WO9113535 | 9/1991 |
| WO | WO 95/21376 | 8/1995 |
| WO | WO9802716 | 1/1998 |
| WO | WO9850757 | 11/1998 |
| WO | WO9900661 | 1/1999 |
| WO | WO9904245 | 1/1999 |
| WO | WO9920977 | 4/1999 |
| WO | WO99/36881 | 7/1999 |
| WO | WO9941597 | 8/1999 |
| WO | WO9945370 | 9/1999 |
| WO | WO99/62107 | 12/1999 |
| WO | WO 00/62012 * | 3/2000 |
| WO | WO 00/38494 | 6/2000 |
| WO | WO01/79822 A1 | 10/2001 |
| WO | WO02/054849 A1 | 7/2002 |
| WO | WO03/027748 A1 | 4/2003 |
| WO | WO03/098148 A1 | 11/2003 |
| WO | WO04/056678 A2 | 7/2004 |

OTHER PUBLICATIONS

C. Smets, K. van Gils, L. Vanderheydt, "A System for 2D and 3D inspection of BGA's Using Vision," Ball Grid Array (BGA) Packaging and Assembly Conference, Singapore, Jan. 16, 1995.

Lau, John, Ball Grid Array Technology, McGraw-Hill, New York, NY, 1995.

Hwang, Jennie S, Ball Grid Array & Fine Pitch Peripheral Interconnections, Electrochemical Publications, Isle of Man, British Isles, 1995.

Blanz, W.E. et al., "Image Analysis Methods for Solder Ball Inspection in Integrated Circuit Manufacturing," IBM Almaden Research Center, San Jose, CA, 1987.

Fandrich, Jurgen et al., "Agile Automated Vision," SPIE vol. 2249, Automated 3D and 2D Vision, 1994.

"ICOS 3-Dimensional BGA Inspection System: Specification," Oct. 22, 1996.

Helm J. D. et al, Improved three-dimensional image correlation for surface displacement measurement, Optical Engineering 34(07), 1911-1920, 1996.

Transcript of hearing in Case No. 00 Civ. 4992 (DC), Scanner Technologies v. Icos Vision Systems, New York, N.Y., Nov. 7-8, 2001, pp. 1-233.

Transcript of trial in Case No. 00 Civ. 4992 (DC), Scanner Technologies v. Icos Vision Systems, New York, N.Y., Mar. 14-18 & 24, 2005, pp. 1-874.

"Confocal scanning optical microscopy and related imaging systems" of T. R. Corle and G. S. Kino, published by Academic Press 1996, pp. xii-xv, 1-7, 46-47, 100-101, 277-281, 330-335.

"Patent Abstract of Japan," vol. 011, No. 293 (P-619), Sep. 22, 1987, publication No. 62-088009, application published Apr. 22, 1987.

"Patent Abstracts of Japan," vol. 1999, No. 13, Nov. 30, 1999, publication No. 11-231228, application published Aug. 27, 1999.

"Patent Abstracts of Japan," vol. 2000, No. 15, Apr. 6, 2001, publication No. 2000-352661, application published Dec. 19, 2000.

* cited by examiner

First view · Second view

First view · Second view in anamorphotic optical system

Field-of-view = lateral object size

Single camera system with straight view and side view next to each other

METHOD AND AN APPARATUS FOR MEASURING POSITIONS OF CONTACT ELEMENTS OF AN ELECTRONIC COMPONENT

RELATED APPLICATIONS

This application claims priority to International Application PCT/BE2002/000001 entitled "A METHOD AND AN APPARATUS FOR MEASURING POSITIONS OF CONTACT ELEMENTS OF AN ELECTRONIC COMPONENT", filed Jan. 2, 2002, which is incorporated herein by reference.

FIELD OF INVENTION

The present invention relates to inspection equipment, more specifically, the inspection of an electronic component and measurement of the position of a set of contact elements.

BACKGROUND

Methods for measuring the positions of a set of contact elements are known in the art, such as PCT/BE00/00020. According to the known methods, a first image is recorded by a first camera, whereas the second image is recorded by a second camera. The positions of the contact elements are then determined based on the data present in the first and second images.

A drawback of the known method and device is that two individual cameras are required. The first camera records the first image, whereas the second records the second image. Consequently two framegabber channels are required to process the image data. Moreover, the two cameras have to be housed in the same apparatus thus requiring a large volume.

It is an object of the present invention to realise a method and an apparatus for measuring respective positions of contact elements of an electronic component where only a single camera is required without affecting the accuracy of the measurement.

SUMMARY

A method or device according to the present invention is therefor characterised in that it comprises:
bringing said set of contact elements in a measurement plane;
illuminating said measurement plane by means of a substantially homogeneous first and second light source;
forming a first light path created by a first light beam produced by said first light source and reflection upon at least one of said contact elements in a direction of a first viewing angle, wherein said first light path starts from said at least one contact element and ends in an image plane of a camera;
forming a second light path created by a second light beam, produced by said second light source and reflection upon said at least one of said contact elements in a direction of a second viewing angle having a different value than said first viewing angle, wherein said second light path starts from said at least one contact element and ends in said image plane of said camera, said first and second light path have a first section each extending as from the measurement plane, said first sections make an angle $20° \leq \alpha \leq 80°$ with respect to each other;
forming a first image of said contact element by means of said camera and by selectively opening said first light path, and forming a second image of said contact element by means of said camera by selectively opening said second light path;
measuring said position by using said first and second image.

By creating a first and a second light path which end both in the image plane of a same camera, two different images can be formed of the same contact elements while using a single camera. The selective opening of the first and second path enables that, the light travelling along the first path, will be blocked when the second path is open and vice versa. In such a manner, the second image obtained by light of the second path will not be affected by the light travelling along the first path. Thus two different images are obtained which enable to determine the positions of the contact elements while using a single camera.

An embodiment of a device according to the invention is characterised in that said first and second light path have a first section, each extending as from the measurement plane, said first sections make an angle $20° \leq \alpha \leq 80°$ with respect to each other and said second light path ends in said image plane of said camera and wherein said apparatus further comprises selection means mounted in said first and second light path and provided for selectively opening either said first or said second light path.

A first preferred embodiment of an apparatus according to the invention is characterised in that said first and second light source are provided for producing light in non-overlapping wavelength ranges. The use of non-overlapping wavelength ranges enables to even more distinguish the light travelling along the first and second light path since consequently light of different wavelength ranges travels along those paths. The light producing the first and second image will thus not interfere.

Preferably selection means provided for selectively opening either said first or said second path are formed by a dichroic mirror. A dichroic mirror in combination with light of different wavelength ranges offers the advantage that for one wavelength range the dichroic mirror is reflective whereas transparent for the other wavelength range.

A second preferred embodiment of an apparatus according to the invention is characterised in that at least one lateral mirror is set up over a viewing angle $\psi$ adjacent the measurement plane, said camera having a resolution of nK×mK where $1 \leq n \leq 2$ and $1 \leq m \leq 2$ and being provided for recording light reflected by said at least one mirror. This embodiment requires a less critical set up of mirrors to construct a first and second light path.

BRIEF DESCRIPTION OF THE DRAWINGS

The invention will now be described in more details with reference to the drawings. In the drawings.

Figure 2:
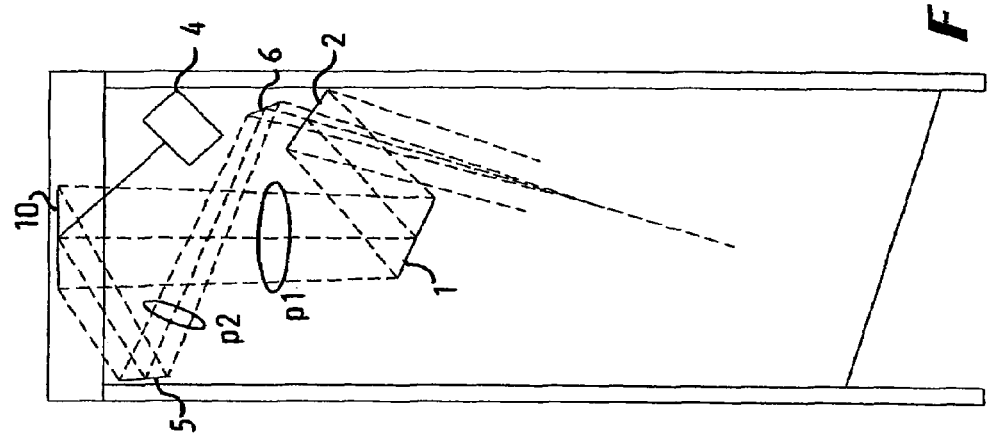
FIG. 2 shows the first and second light path such as formed in the apparatus as shown in FIG. 1.

In the drawings, a same reference sign has been assigned to a same or analogous element.

DETAILED DESCRIPTION

The method according to the invention is designed for the automatic computation of the coplanarity of contact elements of electronic components such as BGA (Ball Grid Array)/CSP (Chip Scale Packaging) and flip-chips devices. Other computation may be performed by the invention, including calculation of two or three dimensional size of elements, the colour and shape of elements and detection of missing or misplaced elements.

Figure 1:
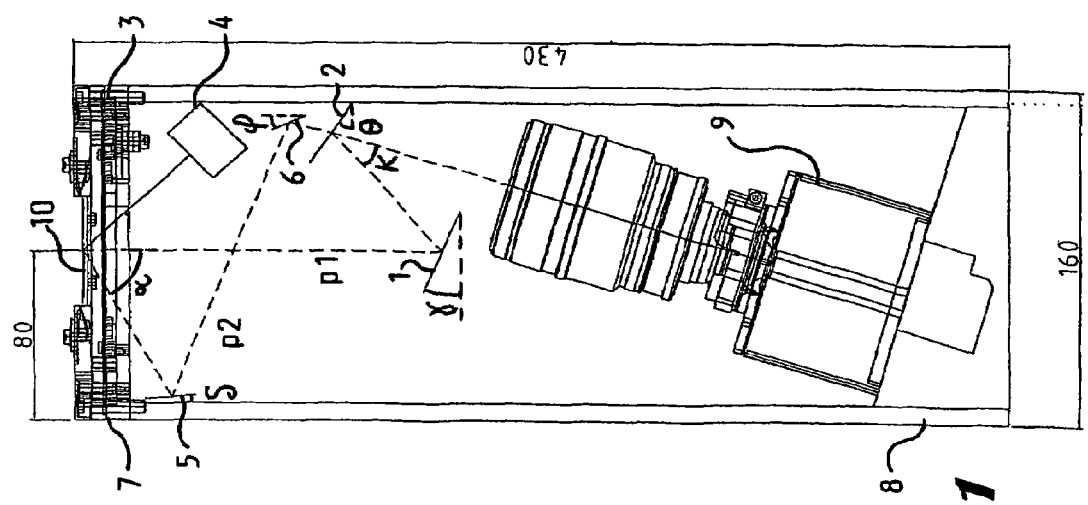
FIG. 1 shows schematically an overall view of a first embodiment of an apparatus according to the present invention.

In the first embodiment of an apparatus 8 according to the present invention and shown in FIG. 1, the electronic component 10 Is placed in a measurement plane 7, in such a manner that its N contact elements are illuminated by a first light source 3. The latter produces a homogeneous illumination of the contact elements preferably at a low incident angle, which is at the most 20°. Preferably, the first light source comprises a high-quality ring-light illumination source. Such a source is built up of a series of LED's which are disposed in a ring, square, hexagonal or other substantially planar geometrical arrangement situated under the plane in which the contact elements are placed. It is important that a substantially homogeneous light field is created which covers the volume in which the contact elements of the component are located. In such a manner, a substantially homogeneous illumination of different contact elements is obtained. In order to obtain a symmetrical illumination, the amount of the angle will be determined by the dimension of the component to be measured. The larger the component, the larger the angle. So, for example, for a component of 40×40 mm, the diameter of the ring will be 15 cm and the incident angle=15°, whereas for a component of less than 15×15 mm, the incident angle=10°.

Since the light source 3 illuminates the surface on which the contact elements are placed from the peripheral of the surface, the sides of the contact elements, generally formed by balls, are illuminated. The light produced by the source 3 is reflected according to a first viewing angle substantially perpendicular with respect to the measurement plane 7 in which the electronic component 10 is situated. That reflected light is incident on a first mirror 1, which is inclined over an angle δ defined in function of the other optical elements forming the apparatus 8.

A second illumination source 4 for example formed by a series of LED's is mounted under the measurement plane 7. The light produced by that second illumination source is incident over an angle on the measurement plane. A second mirror 5, inclined over an angle δ, catches the light produced by the second source 4 and reflected on the surface of the contact element 10. The light reflected by the second mirror 5 is oriented towards a third mirror 6 inclined over an angle φ.

A dichroic mirror 2, inclined over an angle θ reflects the light reflected by the first mirror 1 into the objective of a single camera 9 placed under the first mirror 1 and the dichroic mirror 2. The latter is transparent for the light reflected by the third mirror 6 in such a manner that the latter light also reaches the single camera 9. The camera is preferably a CCD or CMOS camera.

The set up of the illumination sources and the mirrors, such as shown in FIG. 1, enables the formation of a first and a second light path as shown also in FIG. 2. The first light path p1 is created by the first light beam, which is produced by the first illumination source 3 and the reflection of that light in a substantially perpendicular direction with respect to the measurement plane in which the electronic component 10 is set up. The first path p1 has an initial or first section extending between the measurement plane and the first mirror 1. A second section extends between the first mirror 1 and the dichroic mirror 2 and is obtained by the light reflected by the first mirror. A final section of the first path extends between the dichroic mirror 2 and the image plane of the camera 9. The final section is obtained by light reflected towards the camera and incident on the dichroic mirror. In the present example, the angle κ between the incident and reflected light on the dichroic mirror is κ=31°.

The second light path p2 is created by the second light beam which is produced by the second illumination source 4 incident over an angle α, $20°\leq\alpha\leq80°$ on the measurement plane. The initial or first section of the second light path p2 extends in the direction of a second viewing angle α, between the measurement plane and the second mirror 5. The angle δ upon which the second mirror is inclined is i.a. determined by the angle α and the position of the camera. In the present example $2°\leq\delta\leq15°$. A second section of the second light path is obtained by the light reflected by the second mirror 5 and oriented towards the third mirror 6. The orientation of the third mirror is dependent on the one of the second mirror 5 and the camera 9. In the present example $5°\leq\phi\leq35°$. A final section of the second light path extends between the third mirror and the image plane of camera 9. That final section crosses the dichroic mirror and is obtained by light reflected by the third mirror.

The dichroic mirror enables the multiplexing of the images obtained by the light travelling on the one hand along the first path and on the other hand along the second path. A dichroic mirror has the properties that for a first wavelength range it acts as a mirror by reflecting the light, whereas for a second non-overlapping wavelength range the mirror is transparent i.e. acts as a simple glass plate. The dichroic mirror is therefor a wavelength-multiplexer. By assigning now the first wavelength range to the light travelling along the first path and the second wavelength range, non-overlapping with the first range, to the second path, an optical assembly is obtained which has the property to use a single camera for forming two different images.

One possible assignment of wavelength ranges is for example red light in the range of 600 nm to 720 nm for the first source and blue light in the range of 420 nm to 550 nm for the second source. The red light then travels along the first light path p1 and the dichroic mirror 4 acts as a mirror for red light, i.e. reflects the red towards the camera. On the other hand the blue light travels along the second path. As the dichroic mirror 2 is transparent for blue light, the blue light crosses the dichroic mirror in order to reach camera 9.

Preferably, the first and second light source are not switched on together but alternately. Although, even if due to scattering, blue light would reach the first mirror 1 or red light the third mirror 6, this scattered light would not affect the formation of the first and second image by the camera. Indeed, blue light incident on the first mirror and reflected towards the dichroic mirror will cross the latter as the dichroic mirror is transparent for blue light. Red light reaching the third mirror and thus incident on the dichroic mirror in such a manner will be reflected by the latter. A clean separation of both images is thus obtained.

Figure 3:
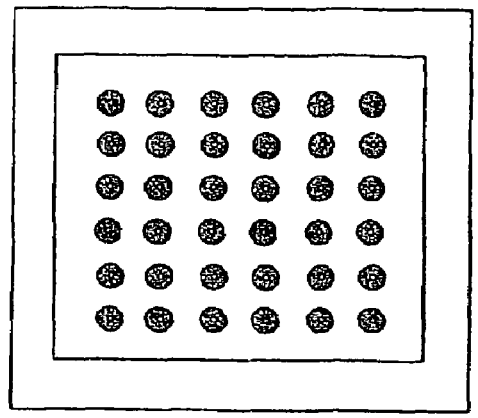
FIG. 3 shows an example of a first and second image recorded by the apparatus shown in FIG. 1.
Figure 3:
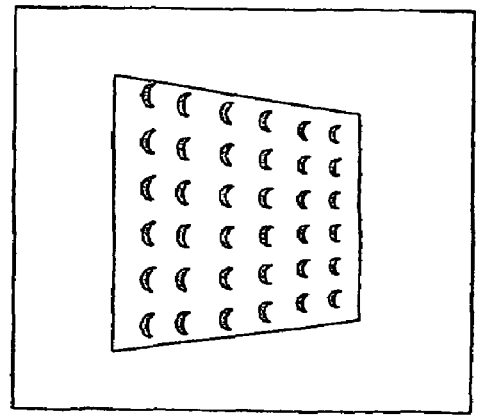

FIG. 3 shows on the left side a first image obtained by light travelling along the first path and on the right side a second image obtained by light travelling along the second path. The first image has the typical doughnut shape, obtained by perpendicular reflection on the contact elements. The second image shows the typical moon shapes due to the lateral illumination over a triangulation angle.

Figure 6:
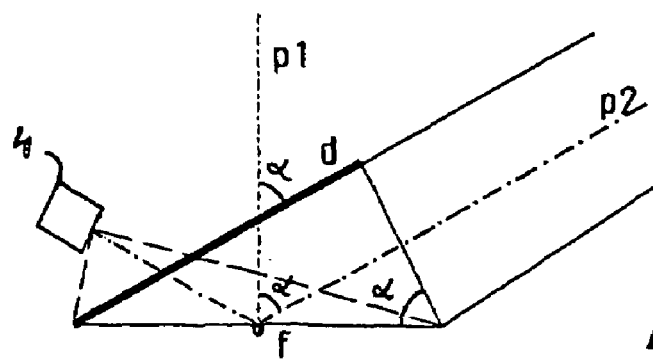
FIG. 6 illustrates the required depth-of-view when using the method of the present invention.

Since in the second light path the optical axis in the initial section is not perpendicular to the measurement plane but makes an angle $\alpha$ with the measurement plane, various points on the electronic component will be at varying distance from the objective used. Consequently there is a requirement for a significant depth-of-view. FIG. 6 illustrates the latter requirement. The required depth-of-view d is expressed as follows:

$$d = f \cdot \sin \alpha$$

where f is the field of view which corresponds to the lateral size of the object or electronic component considered. The required depth-of-view is obtained by using a sufficiently small aperture of the camera objective. As an example, for a field-of-view f=50 mm and a viewing angle $\alpha$=60°, a total depth-of-view of 43 mm is required. The total depth-of-view is given by the wave-optical formula:

$$\text{Depth} = \lambda / (\text{aperture})^2$$

where $\lambda$ is the wavelength of the used light source. Assuming the wavelength $\lambda$=500 nm, the required aperture on the object side is 0.0034, which corresponds to an F-number of 16 for a f=50 mm focal length objective.

Another constraint that must be satisfied by using a single camera is that for both views the average optical length (measured along a central axis of the light path) i.e. the distance between the object and the image plane of the camera, must be substantially the same in order to be able to generate a sharp image with only a single objective. That condition is satisfied by a proper set up of the different mirrors 1, 2, 5 and 6 and their correct inclination in such a manner that the first and second light path have approximately a same optical length.

Some modifications or improvements could be applied to the apparatus shown in FIG. 1. Within a given set up, i.e. for fixed opto-mechanical assembly of mirrors and camera, one may change the field-of-view and thereby camera resolution simply by exchanging the single objective. Objectives of different focal lengths, with suitably adjusted apertures and mounting positions, will all create sharp images filling the camera field entirely, but mapping smaller (large focal length) or larger (small focal length) fields-of-view.

Figure 4:
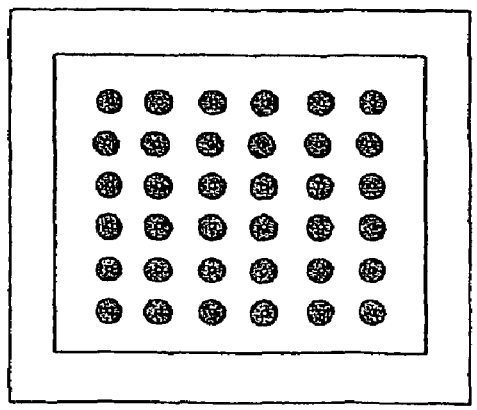
FIG. 4 shows an example of a first and second image recorded by the apparatus shown in FIG. 1 and using an anamorphotic optical system.
Figure 4:
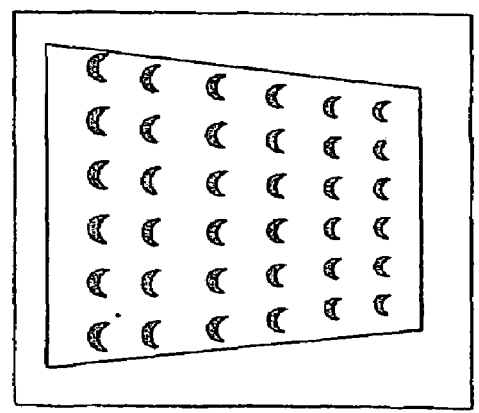

Because of the angular viewing for the second image under an angle a the image height is compressed by a factor of $\cos(\alpha)$ as shown in FIG. 3. That is, an object square of side E is seen as a trapezoid, roughly of width E and height E* $\cos(\alpha)$. Therefor, not the entire area of the image field is used. The resolution and therefor accuracy of the method could be improved by expanding the height of this image, without affecting the width. An optical system with magnifications different for the two orthogonal directions is called an anamorphotic optical system. This can be generated within the second viewing path by means of employing two cylindrical mirrors for the second and third mirrors 5 and 6, replacing the two planar mirrors. The result is shown in FIG. 4. Alternatively, two additional cylindrical lenses could be used within the second path. These two mirrors or two lenses form a beam expander in one direction and have no optical action in the other direction. None of these elements may be part of the first path, the straight viewing path, of course, since here the object aspect ratio should remain unaffected.

It will be clear that the set up such as illustrated in the FIGS. 1 and 2 only shows an example of a possible embodiment of an apparatus according to the present invention. Alternative embodiments could be used for realising the first and second light path. So, for example it is not absolutely necessary that the first path has an initial section extending perpendicularly to the measurement plane, i.e. the first viewing angle being equal to 90°. Other values for the first and second viewing angle are also admitted. Of course the set up of the different mirrors has to be adapted to the choice of the first and second viewing angle and the position of the single camera.

It is also not absolutely required that the first or second light path has different sections. For example, a different alignment of the camera 9 and/or the component 10 or first light source 3 could enable a construction of the first light beam going directly, without using a first mirror 1, towards the image plane of the camera. Further, more or less mirrors than the mirrors 1, 5 and 6 could be used to build up the light paths. What is important is that two light beams are created enabling to form the first and second light path leaving the measurement plane along a first and second viewing angle respectively, where the first and second viewing angle have different values. Each of the light beams have to create each time an image on the image plane of a single camera.

Instead of using a dichroic mirror 2, a semi-transparent mirror could also be used. In the latter embodiment filters or shutters have however to be mounted in the first and second light path. Those filters or shutters should obstruct one light path when the other is open and vice versa. So, for example, when the first light path is open, the shutter has to close the second path. As some light intensity is lost by using semi-transparent mirrors, care should be taken that enough light intensity is produced by the sources 3 and 4.

Figure 5:
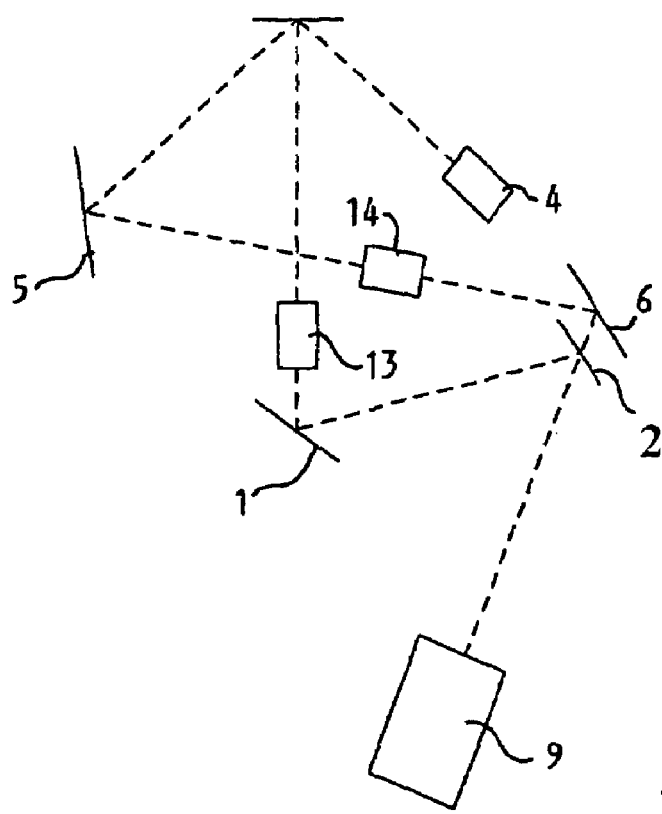
FIG. 5 shows schematically an overall view of a second embodiment of an apparatus according to the present invention.

When filters 13 and 14 are used such as in the embodiment shown in FIG. 5, those filters have of course to be transparent for the wavelength range assigned to the light path in which they are mounted and filter out other wavelengths. In such a manner light from one light path can not interfere with light of the other path and disturb the respective images to be taken.

It is thus important that the light paths are selectively opened either by use of the dichroic mirrors or by using filters or shutters. When using shutters their opening has to be synchronised with the light sources. So, when the first light source 3 is emitting light, shutter 13 has to be open while the second light source should preferably be switched off and shutter 14 has to be closed. The opposite situation occurs when the second light source 4 emits i.e. shutter 13 is closed and shutter 14 is open. The shutters are for example formed by usual diaphragms which are electrically operable or by an LCD.

When using the semi-transparent mirror, the wavelength of the light emitted by both light sources could be the same. Of course when a dichroic mirror is used, it is necessary that the wavelength ranges of both light sources are different and non-overlapping. The first and the second image have to be made subsequently in order to not disturb each other.

Figure 7:
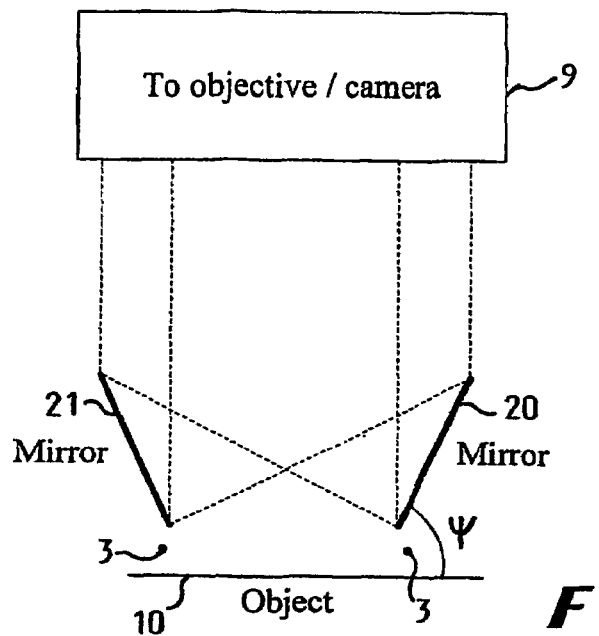
FIG. 7 shows schematically the principle of a third embodiment of an apparatus according to the present invention.
Figure 8:
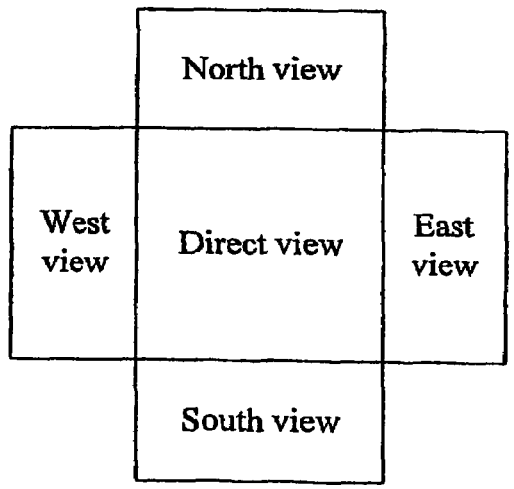
FIG. 8 shows the different image set ups obtained by the apparatus shown in FIG. 5.

Another embodiment of the single-camera solution is shown in FIG. 7 and does not use wavelength multiplex but spatial composition. In this embodiment at least one lateral mirror 20 is placed adjacent to the object 10. The mirror makes an angle $\psi$ with the measurement plane. That angle is situated between 20° and 80°. In the shown embodiment two mirrors 20 and 21, one on the east side and the other on the west side, are placed. Alternatively it could also be possible to place two further mirrors, one on the north side and the other on the south side. In the latter embodiment a direct view, forming the first image, is formed in the middle of the image plane, as shown in FIG. 8, and four further around the direct view, forming the second image.

Figure 9:
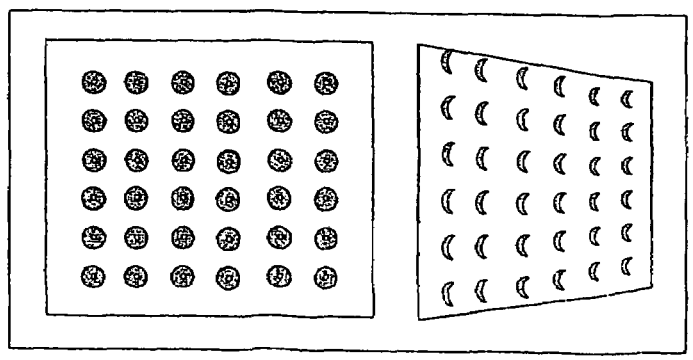
FIG. 9 shows an example of images recorded by the apparatus shown in FIG. 8.

In the embodiment shown in FIG. 7, the single camera and lens view the direct view and the side views next to each other. FIG. 9 shows the images obtained with a set up having a single mirror on the east side. In order to have a same resolution as in the embodiments of FIG. 1 or 5, the camera needs to have more pixels in one direction. For example, with a viewing angle $\psi=60°$, the image size is compressed by a factor 2 (cos $\psi=½$). Consequently, the camera needs to have 1.5 times as many pixels as in the other embodiments. Nevertheless, the use of mirrors adjacent to the measurement plane avoids the use of mirrors and their alignment in the light paths. As an example, if a 1 K×1 K pixel camera is used in the embodiments of FIG. 1 or 5, a 1 K×1,5 K pixel camera would be preferred for a set up with one lateral mirror in order to obtain the same resolution. The depth-of-field requirement is the same as described herebefore.

The more lateral mirrors are used, the more accurate will be the measurement. For an embodiment with 2 mirrors, a 1 K×2 K pixel camera is preferred and a 2 K×2 K pixel camera is preferred when four mirrors are used in order to obtain a same resolution. Generally an nK×mK resolution is preferred with $1 \leq n \leq 2$ and $1 \leq m \leq 2$.

Of course it would also be possible to use a camera with a higher or a lower resolution, depending on the required image quality. The resolution of the camera should in any way be adapted to record both images simultaneously.

By means of employing a more complex set up of normal mirrors and dichroic mirrors, these multiple side view embodiments may also be executed with a camera of smaller pixel number, using again a wavelength multiplex for the various views. Those experienced in the optical art will have no difficulty in devising a multitude of possible set ups, based on the methods outlined above.

The determination of the position of the contact elements is determined on the basis of the recorded images in an analogous manner as described in PCT/BE00/00020 which is hereby incorporated by reference.

The invention claimed is:

1. An apparatus for inspection of an electronic component disposed in a measurement plane, comprising:
   at least one light source provided for generating substantially homogeneous light and illuminating said measurement plane;
   a camera;
   a first light path between said camera and said measurement plane, said first light path having a first section between said measurement plane and a first optical element and a second section between said first optical element and a second optical element, said first section of said first light path being substantially perpendicular to said measurement plane; and
   a second light path between said camera and said measurement plane, said second light path having a first section between said measurement plane and a third optical element and a second section between said third optical element and a fourth optical element
   wherein said at least one light source comprises first and second light sources to produce light in non-overlapping wavelength ranges.

2. The apparatus of claim 1 further comprising means for subsequently switching on/off said first and second light sources.

3. The apparatus of anyone of claims 1 or 2 wherein said second optical element is a dichroic mirror.

4. The apparatus of anyone of claims 1 or 2 further comprising shutters for selectively opening and closing said first and second light paths.

5. The apparatus of anyone of claims 1 or 2 wherein at least one of said second, third and fourth optical elements is a semi-transparent mirror.

6. A method of inspecting an electronic component having a set of contact elements disposed in a measurement plane, comprising:
   illuminating said measurement plane by means of a substantially homogeneous first and second light source;
   forming a first light path between a camera and said measurement plane, said first light path having a first section between said measurement plane and a first optical element and a second section between said first optical element and a second optical element, said first section of said first light path being substantially perpendicular to said measurement plane; and
   forming a second light path between said camera and said measurement plane, said second light path having a first section between said measurement plane and a third optical element and a second section between said third optical element and a fourth optical element;
   forming a first image of said electronic component by means of said camera and by selectively opening said first light path;
   forming a second image of said electronic component by means of said camera and by selectively opening said second light path; and
   measuring a position of said contact elements of said electronic component by using said first and second image.

7. The method of claim 6 wherein said first and second light source produce light with non-overlapping wavelength ranges.

8. The method of anyone of claims 6 or 7, wherein said first and second light path have a substantially equal average optical length.

9. The method of anyone of claims 6 or 7, wherein said first light source illuminates said measurement plane at an incident angle of at most 20.

* * * * *